United States Patent [19]
Ko

[11] Patent Number: 5,974,527
[45] Date of Patent: Oct. 26, 1999

[54] REGISTER FILE AND OPERATING SYSTEM THEREOF

[75] Inventor: Nam-Kon Ko, Seoul, Rep. of Korea

[73] Assignee: LG Semicon Co., Ltd., Cheongju, Rep. of Korea

[21] Appl. No.: 08/915,568

[22] Filed: Aug. 21, 1997

[30] Foreign Application Priority Data

Aug. 30, 1996 [KR] Rep. of Korea ........................ 96-36717

[51] Int. Cl.⁶ .............................. G06F 13/00; G11C 5/06
[52] U.S. Cl. .................. 712/33; 365/63; 710/22
[58] Field of Search ............................. 395/328, 189.08; 365/63; 364/260.2, 951; 711/165; 712/33; 710/22

[56] References Cited

U.S. PATENT DOCUMENTS

| | | | |
|---|---|---|---|
| 5,303,354 | 4/1994 | Higuchi et al. | ........................ 395/325 |
| 5,414,866 | 5/1995 | Ohmae . | |

OTHER PUBLICATIONS

*VLSI RISC Architecture and Organization*, Stephen B. Furber, Ch. 4, pp. 290–291.

Denis Howe, The Free On-Line Dictionary of Computing, http://www.instantweb.com/~foldoc/, field effect transistor, Oct. 1995.

*Primary Examiner*—Edward R. Cosimano
*Assistant Examiner*—Laura H. Pluta
*Attorney, Agent, or Firm*—Fleshner & Kim

[57] ABSTRACT

The present invention relates to a register file in a microprocessor and operating system thereof for performing a data transfer between register cells within a register file. The register file has a plurality of register cells and an internal common bus that can directly transfer data between register cells by binding together control units for feedback transmission in each register cell to perform a direct data transfer between register cells. Each of the registers cell includes a repeater cell, a data input control unit, a data transfer control unit and a feedback transmission control unit.

20 Claims, 8 Drawing Sheets

REGISTER FILE AND OPERATING SYSTEM THEREOF

BACKGROUND OF THE INVENTION

1. Field of the Invention

The present invention relates to a register file and operating system thereof in a microprocessor, and in particular, to a register file and operating system thereof in a microprocessor for performing a data transfer between repeater cells within a register file.

2. Background of the Related Art

Figure 1:
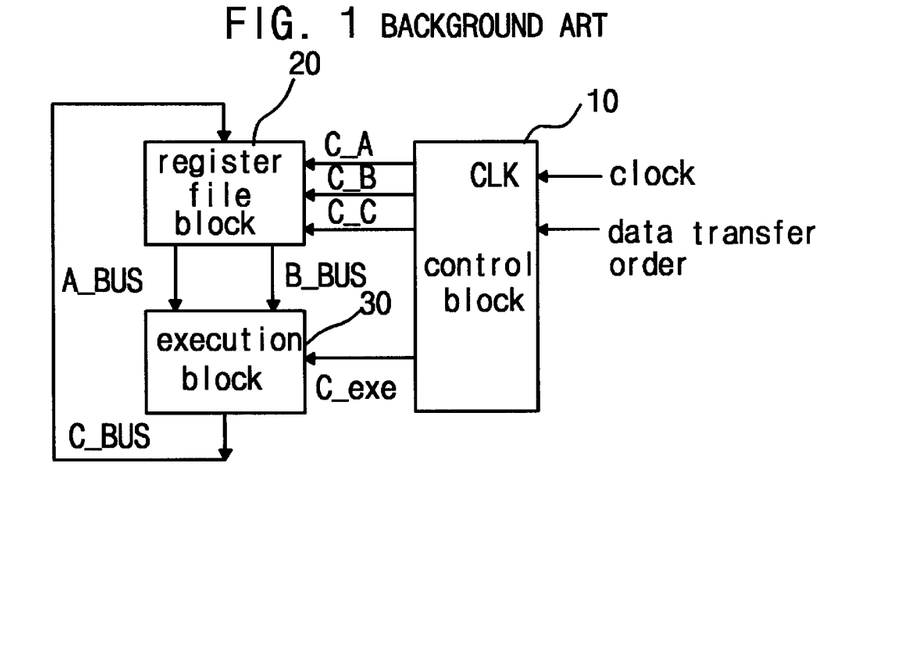
FIG. 1 is a block diagram showing an operating system of a related art register file.

As shown in FIG. 1, the operating system for a related art register file consists of a register file block 20, execution block 30 and control block 10.

The process for storing data in the related art register file block 20 will now be explained. According to control signals C-A, C-B and C-C from the control block 10, data are transferred from the execution block 30 to the register file block 20 by a third bus C-BUS. Data stored in the register file block 20 are emitted by first and second buses A-BUS, B-BUS. The execution block 30 carries out a particular function, e.g. an arithmetic operation with data from the register file block 20 carried on A-BUS and B-BUS after receiving a control signal C-exe from the control block 10. Then, the execution block 30 emits the result into the register file block 20 using the C-BUS. The control block 10 receives a clock signal CLOCK of a synchronous signal and data transfer order from an external device (not shown) and generates the first, second and third control signals C-A, C-B, C-C for controlling operation of the register file block 20 and the control signal C-exe for controlling operation of the execution block 30. Thus, the related art register file block 20 acts only as a memory device.

Figure 2:
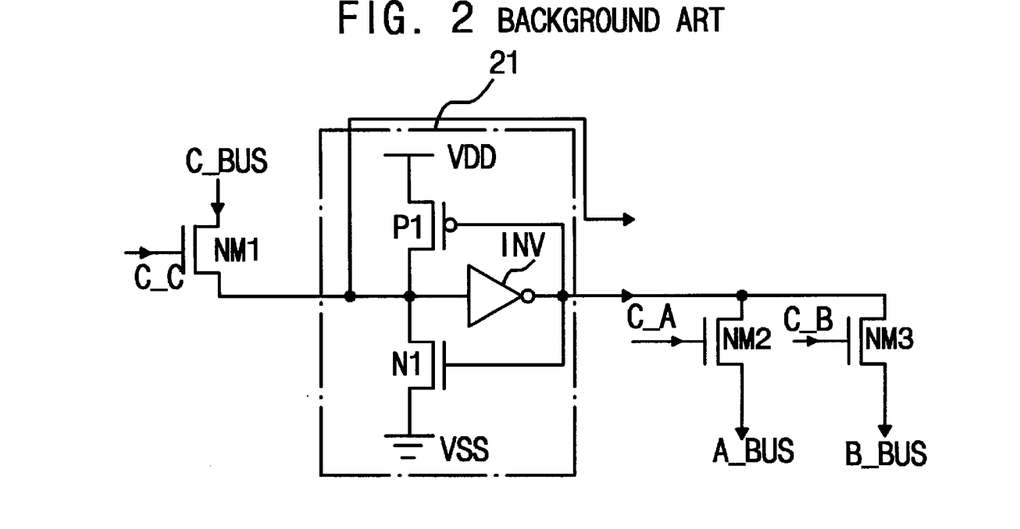
FIG. 2 is a circuit diagram showing a register cell of a related art register file.

As shown in FIG. 2, a register cell making up a register file block 20 includes a first MOS transistor NM1 operating ON or OFF based on signals entered through its drain and gate. The drain is coupled to the C-BUS carrying data from the execution block 30 and the gate receives the third control signal C-C. Second and third MOS transistors NM2, NM3 also operate ON or OFF based on signals entered through their drains and gates. At this time, their drains are coupled to the output of a repeater cell 21 and the gates receive the control signals C-A and C-B from the control block 10, respectively.

The repeater cell 21 includes an inverter INV and two MOS transistors N1, P1, which operate to keep the input voltage state of the inverter INV by reverting the output signal from the inverter INV to maintain an output voltage state of the repeater cell 21. Further, the repeater cell may be composed of a positive or negative logic circuit for selecting its output signal.

Figure 3:
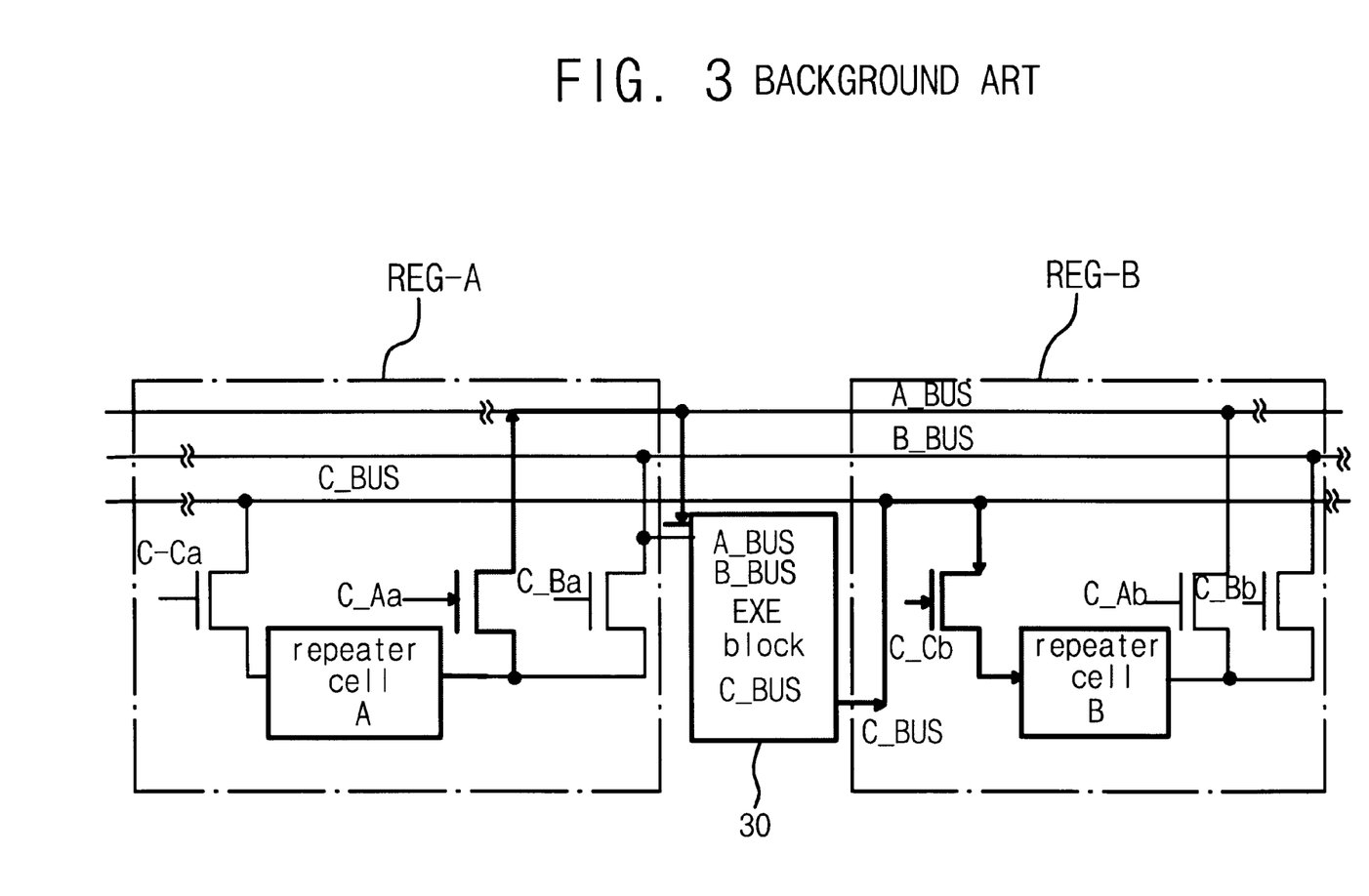
FIG. 3 is a flow diagram showing a data transfer between the related art register cells of FIG. 2.

A plurality of register cells forms a register file block such as the register block 20. As shown in FIG. 3, data from a source register cell enter the execution block 30 on the data path and the execution block 30 emits data into a destination register cell using the output bus C-BUS.

In a microprocessor with the related art register files, a data transfer between register cells requires an execution unit. Accordingly, the control block 10 receives the clock signal and the data transfer order to generate the appropriate control signals C-A, C-B, C-C. Thus, the overall efficiency of the microprocessor is reduced.

Figure 4:
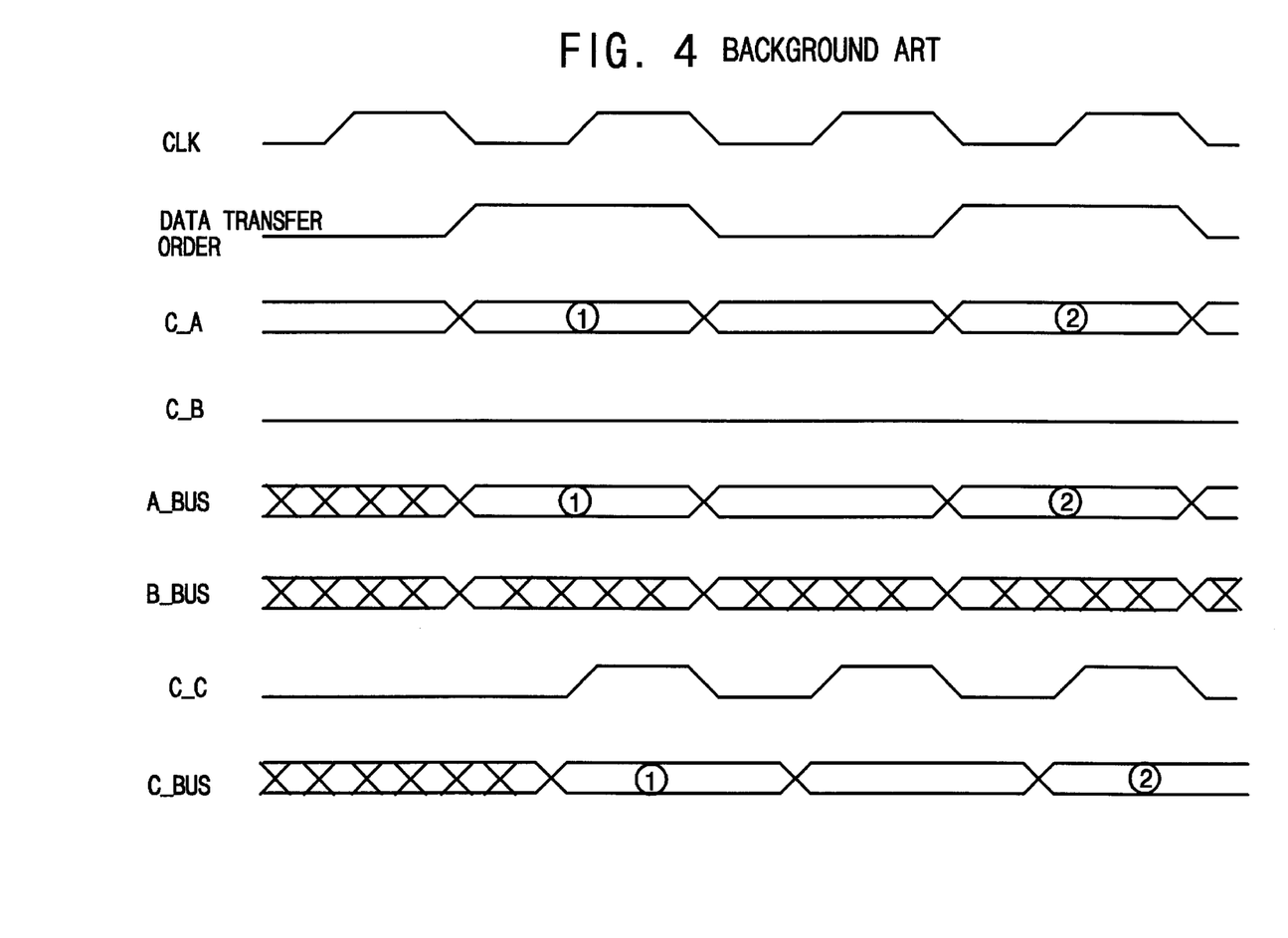
FIG. 4 is a diagram showing timing of the related art register file of FIG. 1.

Each waveform of the control signals, input and output signals is illustrated in FIG. 4. Reference numbers 1 and 2 show a sequence of available signals during each signal output. First, when the third control signal C-C is high level when the third bus C-BUS is carrying a signal, the first MOS transistor NM1 operates, and the signal carried on the third bus C-BUS enters the repeater cell 21. Thus, the register file with a plurality of repeater cells stores data according to the signal carried on the C-BUS. At this time, when the first control signal C-1 or the second control signal C-B is high level, the data stored in the repeater cell 21 are respectively emitted by the A-BUS or the B-BUS.

In the related art register file, most registers can be designated a source or destination register. However, because some registers for logical multiply or any other particular purpose are exclusive, an additional transfer cycle between registers is needed for a data transfer from specific predetermined registers to another register. That is, an additional clock cycle and data transfer order are required.

As a result, the overall efficiency of a microprocessor is decreased. In other words, when the result from a logic operation within one register file is transferred to another register, the transfer time consumption reduces the efficiency of the microprocessor.

SUMMARY OF THE INVENTION

An object of the present invention is to overcome at least the above described problems and disadvantages of the related art.

Another object of the present invention is to provide a register file with additional transistors and operating system thereof, which enables a parallel data transfer order between registers without an additional unit as well as a general order.

It is yet another object of the present invention to provide a register file and operating system that transfers data between registers in a microprocessor where the execution block is not used.

It is still yet another object of the present invention to provide a register file and operating system that reduces time consumption of and thereby increases the utilization rate of register files.

To achieve at least the above objects in whole or in part, a register cell of the present invention includes a repeater cell that keeps the state of an input signal and continues to emit the maintained input signal unless the input signal is changed. A data input control unit that transfers data carried on an input bus to the repeater cell based on a first control signal. A data transfer control unit that emits data from the repeater cell to an external data transfer bus based on a second control signal, and a feedback transmission control unit that forms a feedback transmission line to return data from the repeater cell to the repeater cell abased on a third control signal.

To achieve the objects of the present invention in whole or in part, a register file operating system includes a register file block, an execution block and a control block. The register file block stores data entered by a third bus and emits the stored data using a first or a second bus according to a control signal. The execution block executes a particular function with the data emitted from the register file block by the first or second bus and then transfers the result into the register block using the third bus. The control block receives the clock signal of synchronous signal and a data transfer order from an external device to generate additional control signals for the register file block and the execution block. The register file block includes a plurality of register cells and a coupling between a sending transistor of a predetermined register cell and a receiving transistor of a next register cell or the receiving transistor of the predetermined register cell and the sending transistor of the next register cell to perform a direct data transfer from the predetermined register cell to the next register cell without passing through the execution block based on fourth and fifth control signals from the control block.

To achieve the above objects of the present invention in whole or in part, a register file including a plurality of register cells and including an internal common bus directly transfers data between register cells by binding together feedback transmission control units provided in each register cell. The register cell includes a repeater cell keeping the state of input signal and continuing to emit the maintained input signal unless the input signal is changed. A data input control unit that transfers data carried on the input bus to the repeater cell according to a first control signal. A data transfer control unit that emits data from the repeater cell to an external data transfer bus according to a second control signal, and a feedback transmission control unit that forms a feedback transmission line to return data from the repeater cell to the repeater cell according to a third control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 5:
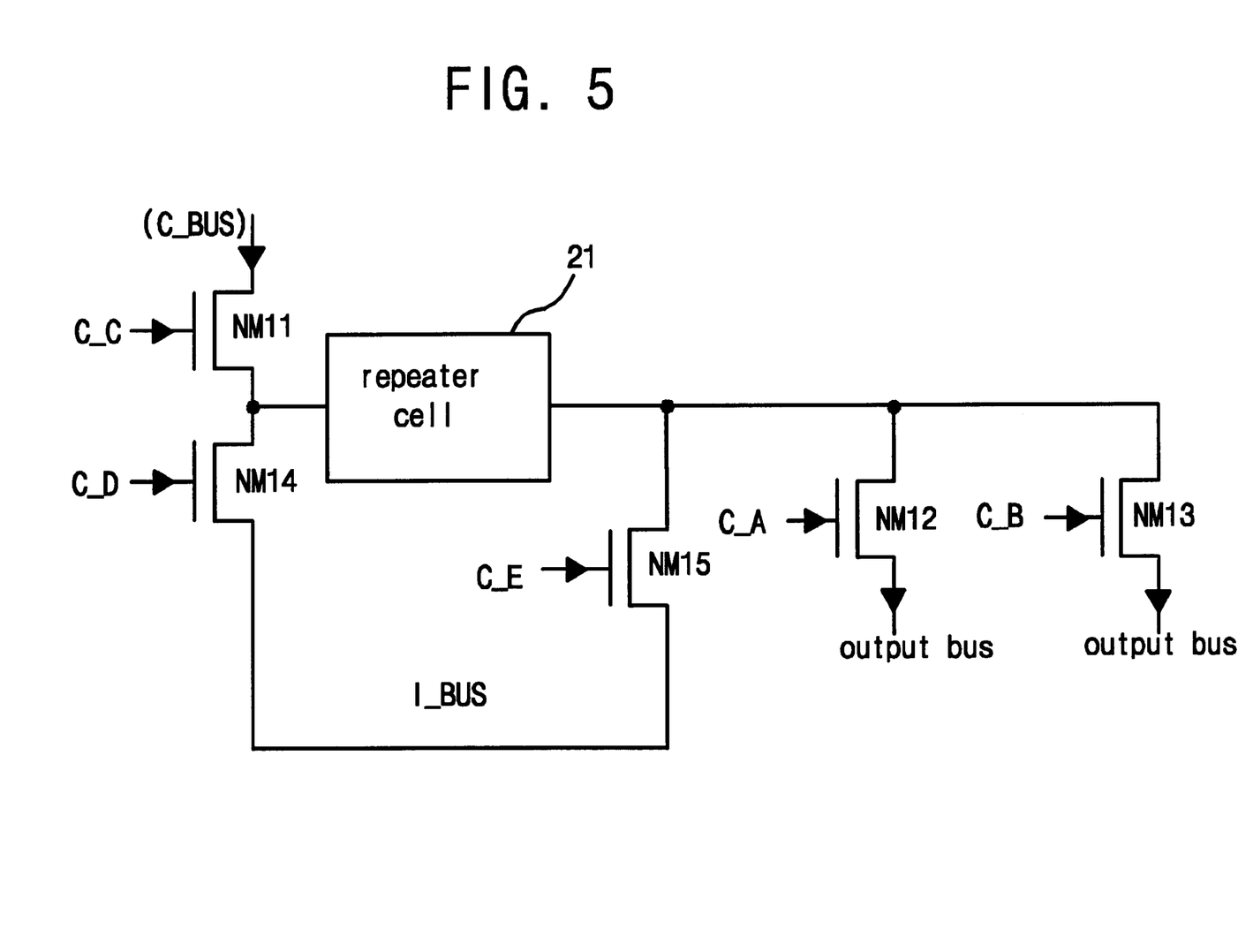
FIG. 5 is a circuit diagram showing a preferred embodiment of a register cell according to the present invention.

FIG. 5 shows a first preferred embodiment of a register cell according to the present invention in which five MOS transistors NM11–NM15 are coupled to one repeater cell 21.

The register cell of FIG. 5 is coupled to a register file block, an execution block and a control block. The register file block is storing data entered by a third bus and emitting the stored data using a first bus or the second bus according to a first control signal.

Figure 8:
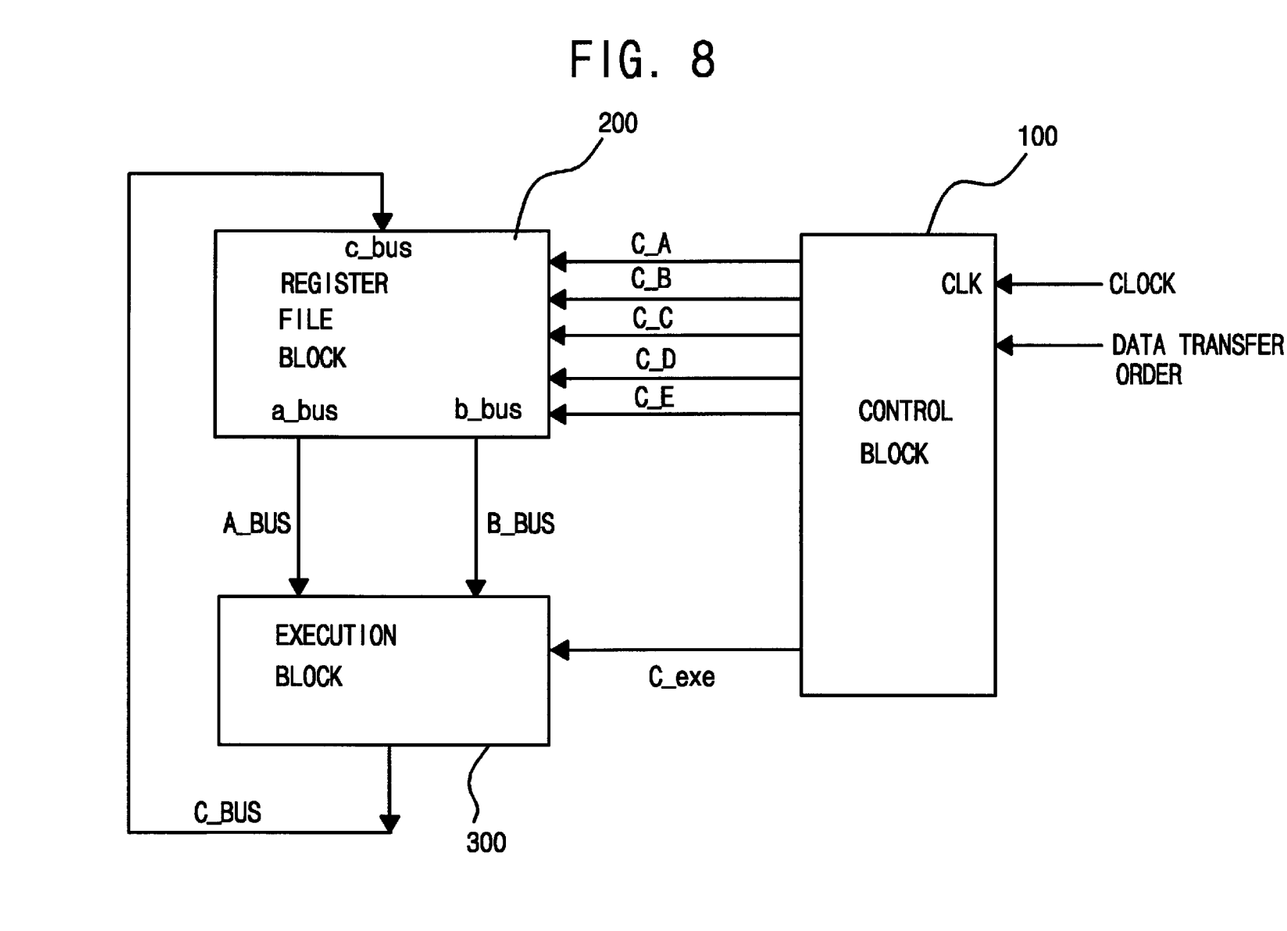
FIG. 8 is a block diagram showing a preferred embodiment of an operation system and a register file according to the present invention.

The execution block performs a particular function according to an execution control signal with the stored data, which are emitted from the register file block by the first or second bus. The execution block then transfers the result into the register block using the third bus. The control block receives a clock signal and data transfer order from an external device or the like (not shown) to generate control signals for the register file block and the execution control signal for the execution block. In addition, as shown in FIG. 8, a portion where the drain of the fourth MOS transistor NM14 and the source of the fifth MOS transistor NM15 meet is a fourth bus I-BUS.

Figure 6:
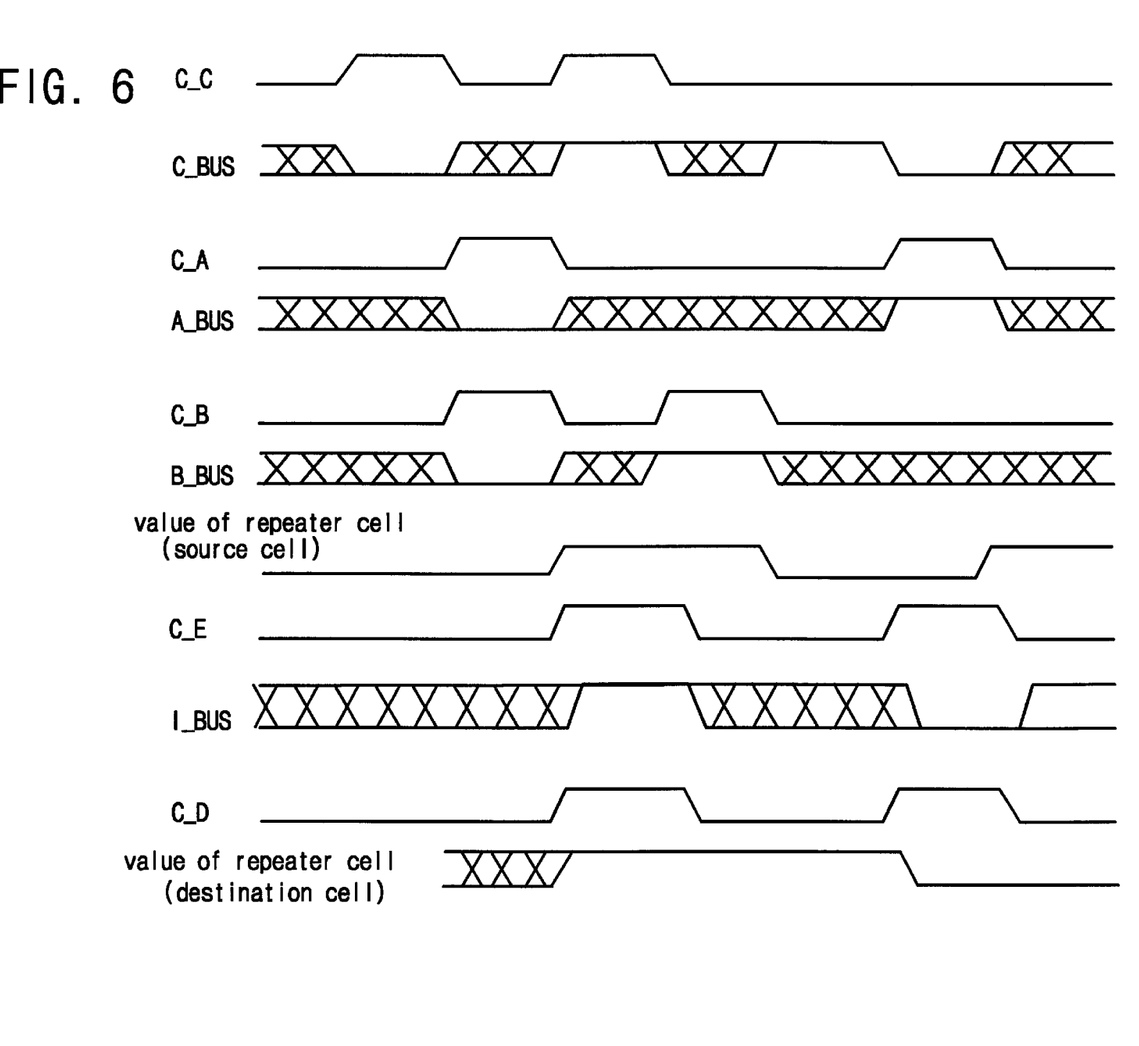
FIG. 6 is a diagram showing timing of operations of the register cell of FIG. 5.

Operation of the register cell of FIG. 5 will now be described. As shown in FIG. 6, operation of the first, second and third control signals C-A, C-B, C-C is similar to the related art when both fourth and fifth control signals C-D, C-E are high level.

When performing a direct data transfer method according to the present invention, the fourth control signal C-D preferably has an opposite level relative to the fifth control signal C-E.

Figure 7:
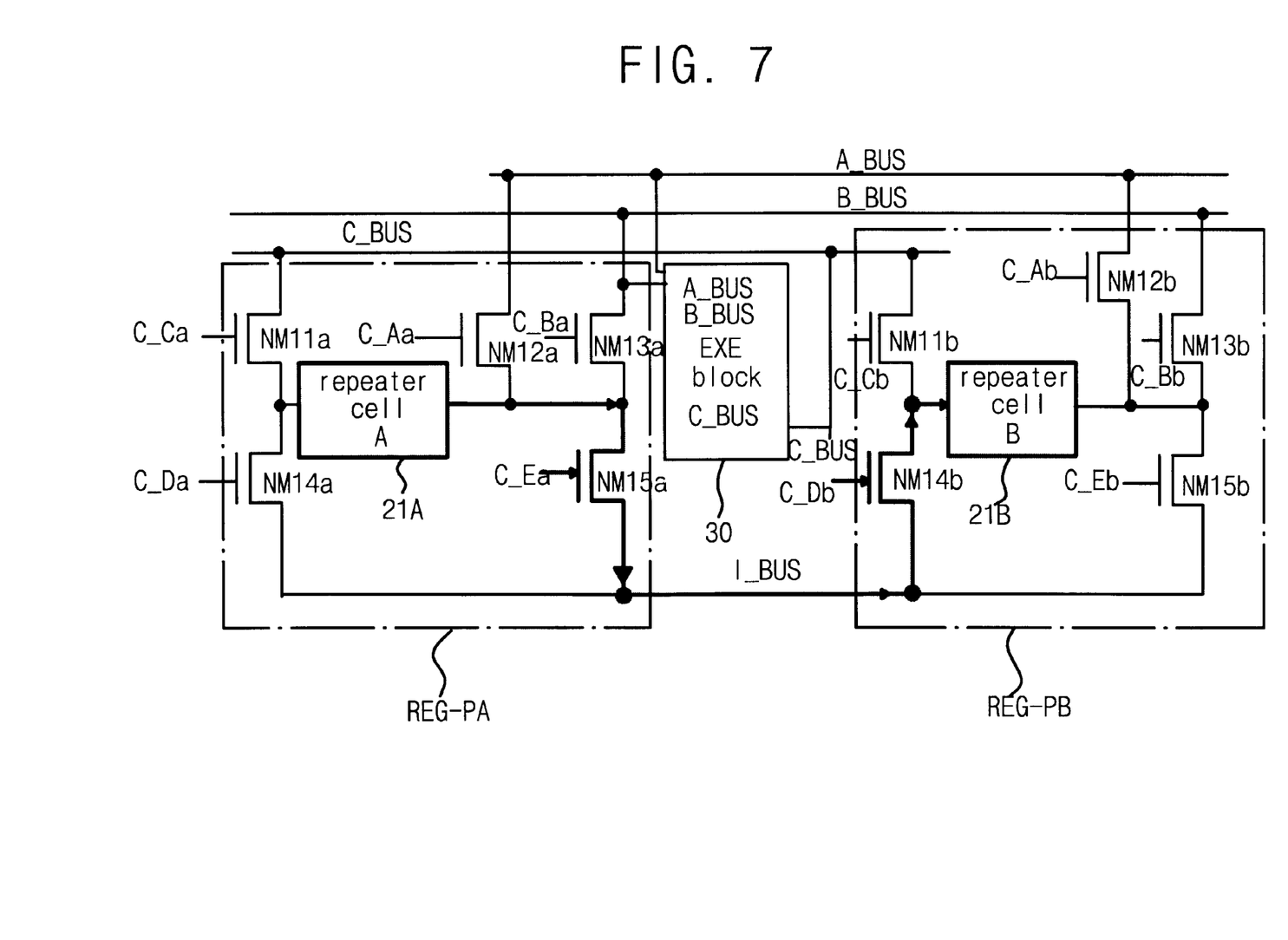
FIG. 7 is a flow diagram showing a data transfer between register cells of FIG. 5.

FIG. 7 shows data flow of the direct data transfer between register cells within a register file block, which has a plurality of register cells according to the first preferred embodiment. As shown in FIG. 7, when the fifth NMOS transistor NM15a is ON and the fourth NMOS transistor NM14a coupled to the input terminal of the first repeater cell 21A is OFF, data enter the drain of the fourth NMOS transistor NM14b, which is coupled to the input of the second repeater cell 21B. At this time, if the fourth NMOS transistor NM14b remains ON, data from the first repeater cell 21A is stored in the second repeater cell 21B without passing through the execution block.

FIG. 8 shows a first preferred embodiment of an operating system according to the present invention for direct data transfer between register cells using an exemplary register file. The operating system includes a control block 100, a register file block 200 and an execution block 300. The register file block 200 stores data entered via a third bus C-BUS and emits the stored data using a first bus A-BUS or a second B-BUS according to corresponding control signals C-A and C-B.

The execution block 300 carries out a particular function according to a control signal C-exe with the stored data, which are emitted from the register file block 200 by the first bus A-BUS or the second B-BUS. The execution block then transfers the result into the register file block 200 using the third bus C-BUS.

The control block 100 receives a clock signal CLOCK, which is preferably a synchronous signal and a data transfer order preferably from an external device (not shown) to generate the control signals C-A, C-B, C-C, C-D, C-E for the register file block 200 and the control signal C-exe for the execution block 300.

Figure 9:
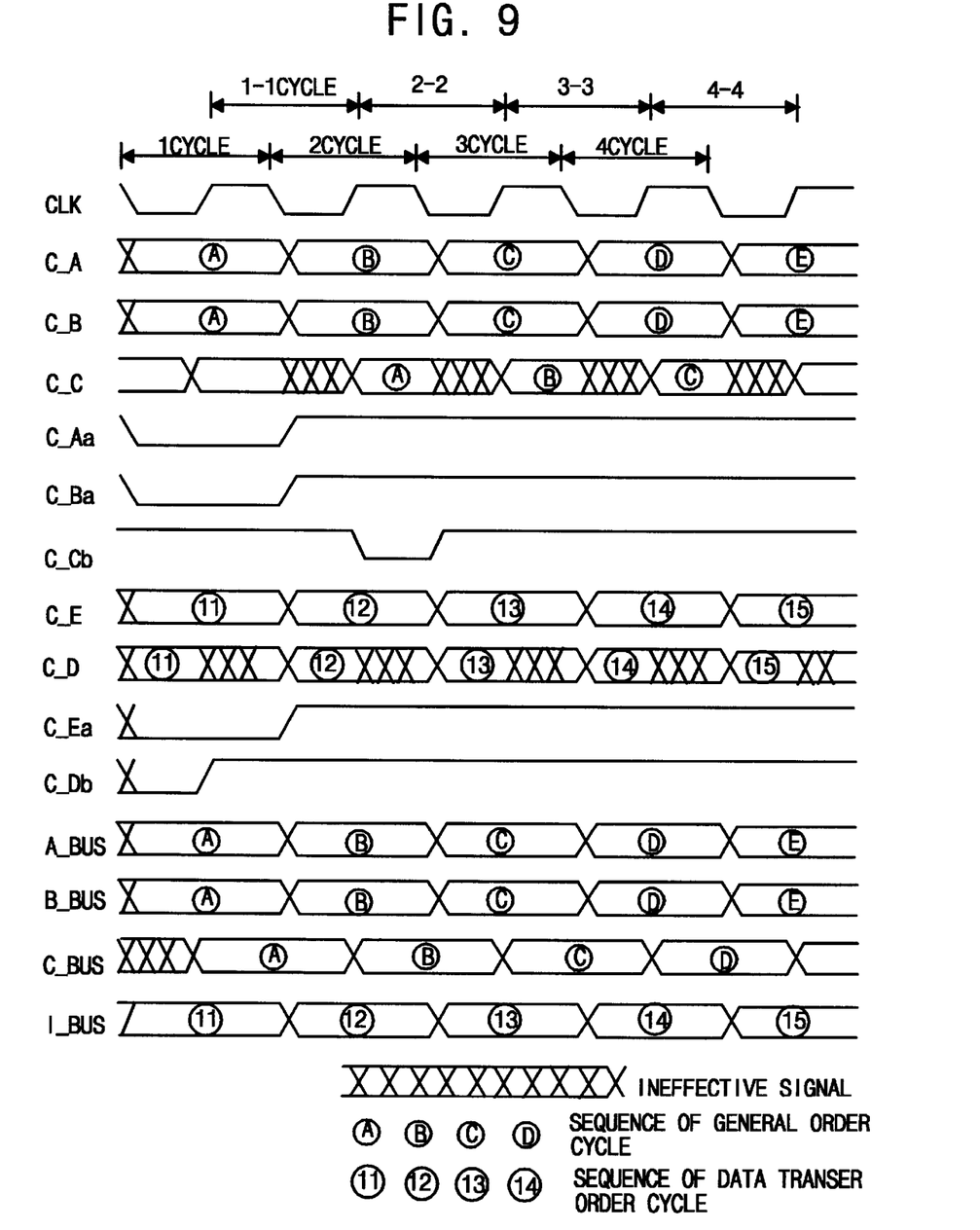
FIG. 9 is a diagram showing timing of operations of the register file of FIG. 8.

FIG. 9 shows waveforms of signals during operations of the register file block 200. All signals in FIG. 9 are operated based on the clock signal CLK. The legends A to E within the waveforms represent the first to third control signals C-A, C-B, C-C that enter the register file block according to a general order, input data to register file (data carried on the third bus C-BUS) and output data from register file (data carried on the first and second buses A-BUS, B-BUS).

Also, reference numbers 11 to 14 within the waveforms represent the fourth and fifth control signals C-D, C-E that enter the register file block pursuant to the preferred embodiments based on a data transfer order and output data from the register file (data carried on the fourth bus I-BUS).

Further, the first and second control signals C-A, C-B of a source cell represent signals entering the register cell RES-PA selected as a source cell within a register file block 200 during the general order performance. In the meantime, the third control signal C-Cb of the destination cell represents a signal entering the register cell REG-PB selected as a destination cell within the register file block 200 during the general order performance.

Thereby, during general order performance within the register file block 200, data stored in the source cell REG-PA are carried on the first and second buses A-BUS, B-BUS for the first clock cycle. Depending upon the order, the data are carried on either the first bus A-BUS or the second B-BUS. At this time, data respectively carried on the A-BUS and the B-BUS are received from different register cells, respectively.

That is, the A-BUS and the B-BUS have different register cells relative to each other and each register cell emits data into the assigned bus. Preferably, a signal comes from the control block 100 to assign a register cell to be used according to a corresponding order. For the second clock cycle, the execution block 300 reads data from the first and second buses A-BUS, B-BUS and performs the order, and emits the results of the executed operation on the stored data to the third bus C-BUS for the second-second clock cycle. The results carried on the C-BUS are stored in the second repeater cell 21B by the third control signal C-Cb of the destination register cell REG-PB.

A data transfer from the source cell REG-PA to the destination cell REG-PB can be directly performed at the same time during the general order performance as described above. For the first clock cycle, the source cell REG-PA transfers data stored in the first repeater cell 21A to the fourth bus I-BUS depending on the entered fifth control signal CEa. Simultaneously, the fourth control signal C-Db of the destination cell REG-PB is stored in the second repeater cell 21B.

Thereby, data from the source cell REG-PA are stored in the destination cell REG-PB during the first clock cycle, and data transfer order is completed. Between other registers, data can be transferred during the following clock cycle. Thus, in every clock cycle, data is transferred between register cells. Reference numbers 11 to 14 within the waveforms shown in FIG. 9, show cycles of data transfer in every clock cycle. Therefore, a general order and a data transfer order between registers can be performed in parallel at the same time.

As described above, when the register file according to the present invention and operating system thereof are provided, a data transfer between registers does not use the execution block, which lowers of the utilization rate of register file. Accordingly, the register file has additional time to perform other operations. Further, the computational time is reduced. Thus, overall capability of a microprocessor can be improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A plurality of register cells that form a register file, each register cell comprising:
    a repeater cell that repeats an input signal;
    a data input control unit that transfers data from an input bus to the repeater cell according to a first control signal;
    a data transfer control unit that transmits data from the repeater cell to an external data transfer bus according to a second control signal;
    a feedback transmission control unit that feeds back data output by the repeater cell to an internal bus coupling the data input control unit and the data transfer control unit according to a third control signal.

2. The plurality of register cells of claim 1, wherein the repeater cell maintains a high level or a low level of the input signal.

3. The plurality of register cells of claim 1, wherein the external data transfer bus is one of a first bus and a second bus.

4. The plurality of register cells of claim 1, wherein the internal bus forms a feedback transmission line to feed back the output data from the repeater cell to an input of the repeater cell.

5. The plurality register cells of claim 1, wherein the feedback transmission control unit is a transistor having a second electrode as an input terminal, a first electrode as an output terminal and a control electrode receiving a control signal, wherein the transistor inputs a signal from the second electrode and transmits the signal through the first electrode.

6. The plurality register cells of claim 1, wherein the transistor is an N type MOS transistor, the first electrode is a source, the second electrode is a drain and the control electrode is a gate.

7. The plurality of register cells of claim 1, wherein the repeater cell repeats the input signal until the input signal is changed.

8. A register file comprising:
    a plurality of register cells, wherein each of said register cells comprises,
        a repeater cell that repeats an input signal,
        a data input control unit that transfers data from an input bus to the repeater cell according to a first control signal,
        a feedback transmission control unit that feeds back data output by the repeater cell to the bus coupling the data input control unit and the data transfer control unit, and
        a data transfer control unit that transmits data from the repeater cell to an external data transfer bus according to a second control signal; and
    a bus coupling each of the plurality of register cells to allow direct transfer of data between register cells.

9. The register file of claim 8, wherein the feedback transmission control unit feeds back data output by the repeater cell to the bus coupling the data input control unit and the data transfer control unit according to a third control signal.

10. The register file of claim 9, wherein the bus directly transfers the data between two register cells by coupling the feedback transmission control units provided in said each register cell.

11. The register file of claim 9, wherein said feedback transmission control unit comprises switching units for two transmission lines respectively coupled to the input and output terminals of said each repeater cell.

12. The register file of claim 11, wherein the switching units for the two transmission lines are alternately enabled for data transfer between register cells.

13. The register file of claim 11, wherein only the transmission line switching unit for the output terminal of a source register cell repeater cell and the transmission line switching unit for the input terminal of a destination register cell repeater cell are enabled for data transfer between the source register cell and the destination register cell.

14. A register file operating system, comprising:

a register file unit storing data entered by a third bus and emitting the stored data using a first bus or a second bus based on a control signal, wherein the register file unit comprises,
- a plurality of register cells, wherein each of said register cells comprises,
  - a feedback transmission unit that feeds back data output by a source register cell to a destination register cell within the register file, and
  - a data transfer unit that transmits the data emitted from the register file unit and receives result data using an external data transfer bus according to a second control signals; and
- a bus coupling each of the plurality of register cells to allow direct transfer of data between the feedback transmission units of the source and destination register cells;

an execution unit executing a prescribed function with the data emitted from the register file unit, and then transferring the result data into a selected register cell of the register file unit using the third bus;

a controller receiving a clock signal and a data transfer order to generate control signals for the register file unit and execution control signal for the execution unit, wherein the register file unit performs a direct data transfer from the source register cell to the destination register cell according to fourth and fifth control signals from the controller.

15. The register file operating system of claim 14, wherein the direct data transfer does not pass the data through the execution unit.

16. The register file operating system of claim 14, wherein the plurality of register cells are coupled between a forwarding transistor of the source register cell and a receiving transistor of the destination register cell to perform the direct data transfer.

17. The register file operating system of claim 16, wherein the plurality of register cells are coupled between a receiving transistor of the source register cell and a forwarding transistor of another register cell.

18. The register file operating system of claim 14, wherein each of the register cells comprises:

- a first transistor having a second electrode coupled to the third bus, which transfers data from the execution unit, and operating ON or OFF by receiving a third control signal from the controller through a control electrode;
- a repeater cell storing data from the first electrode of said first transistor;
- second and third transistors having a second electrode coupled to the output of said repeater cell and operating ON or OFF according to respective first or second control signals from the controller, which enters a control electrode, to emit data stored in said repeater cell using the first bus and the second bus coupled to the execution unit;
- a fifth transistor having a second electrode coupled to the output of said repeater cell and operating ON or OFF according to the fifth control signal from the controller, which enters a control electrode;
- a fourth transistor having a second electrode coupled to the first electrode of said fifth transistor and a first electrode coupled to the first electrode of said first transistor and operating ON or OFF according to the state of the fourth control signal from the controller, which enters a control electrode, to transfer data from the first electrode of said fifth transistor into said repeater cell, when said fifth transistor is ON.

19. The register cell of claim 18, wherein each transistor is an N type MOS transistor where the first electrode is a source, the second electrode is a drain and the control electrode is a gate.

20. The register file operating system of claim 14, wherein the data transfer signal is generated external to the register file operating system.

* * * * *